(12) United States Patent
Park

(10) Patent No.: US 7,633,105 B2
(45) Date of Patent: Dec. 15, 2009

(54) CMOS IMAGE SENSOR AND METHOD OF MANUFACTURE

(75) Inventor: Jeong-Su Park, Inoheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 81 days.

(21) Appl. No.: 11/963,465

(22) Filed: Dec. 21, 2007

(65) Prior Publication Data

US 2009/0014760 A1    Jan. 15, 2009

(30) Foreign Application Priority Data

Dec. 29, 2006  (KR) ...................... 10-2006-0137314

(51) Int. Cl.
 *H01L 31/113* (2006.01)
(52) U.S. Cl. ............... 257/292; 257/294; 257/E21.001; 257/E31.001; 438/69
(58) Field of Classification Search ......... 257/292–296, 257/E31.001, E21.001; 438/68, 69
See application file for complete search history.

(56) References Cited

U.S. PATENT DOCUMENTS

| | | | |
|---|---|---|---|
| 2004/0114075 | A1 | 6/2004 | Iwasa |
| 2005/0140274 | A1 | 6/2005 | Lee et al. |
| 2006/0011808 | A1 | 1/2006 | Li et al. |
| 2006/0011813 | A1* | 1/2006 | Park et al. ................. 250/208.1 |
| 2008/0006859 | A1* | 1/2008 | Mionetto .................... 257/294 |
| 2008/0036023 | A1* | 2/2008 | Park .......................... 257/432 |

FOREIGN PATENT DOCUMENTS

CN    1638553    7/2005

* cited by examiner

*Primary Examiner*—N Drew Richards
*Assistant Examiner*—Mamadou Diallo
(74) *Attorney, Agent, or Firm*—Sherr & Vaughn, PLLC

(57) ABSTRACT

A CMOS image sensor that is capable of substantially completely intercepting unnecessary light incident from the outside and preventing the occurrence of a hot pixel phenomenon and a method of fabricating the same are disclosed. A CMOS image sensor includes an epitaxial layer having a plurality of photodiodes. The epitaxial layer may be formed over a main pixel region and a dummy pixel region, which may be defined on a semiconductor substrate. A device passivation layer may be formed by depositing and planarizing oxide over the epitaxial layer. A silicon oxide layer may be formed by depositing and planarizing silicon oxide over the device passivation layer. The silicon oxide layer may have a concavo-convex type oxide pattern over the main pixel region and a planar oxide pattern over the dummy pixel region. A plurality of dark matrix elements may be formed by sequentially stacking a dual layer and a metal layer over the silicon oxide layer. A planarization process may be performed until the concavo-convex type oxide pattern is exposed. Micro lenses may be formed such that the micro lenses are aligned with photodiodes which will be formed at the main pixel region and the dummy pixel region.

20 Claims, 4 Drawing Sheets

CMOS IMAGE SENSOR AND METHOD OF MANUFACTURE

The present application claims priority under 35 U.S.C. 119 to Korean Patent Application No. 10-2006-0137314, filed on Dec. 29, 2006, which is hereby incorporated by reference in its entirety.

BACKGROUND

An image sensor converts an optical image into an electric signal. Image sensor may be classified as complementary metal oxide silicon (CMOS) image sensors or charge coupled device (CCD) image sensors. The CCD image sensor has relatively higher photosensitivity and lower noise than CMOS image sensors. However, CCD image sensors are more difficult to miniaturize, and integrate with other devices. Power consumption of the CCD image sensor is also higher. On the other hand, CMOS image sensors are prepared using a more simplified process than CCD image sensors. CMOS image sensors are easier to miniaturize, and integrate with other devices. Power consumption of the CCD image sensor is also higher.

With advances in technologies for preparing semiconductor devices, technology for preparing the CMOS image sensors, and consequently the characteristics of the CMOS image sensors, have been greatly improved. Accordingly, much research has been recently carried out on the CMOS image sensor.

A pixel of the CMOS image sensor includes photodiodes for receiving light and CMOS devices for controlling image signals from the photodiodes. The photodiodes generate electron-hole pairs, depending on the wavelength and intensity of red light, green light, and blue light incident through color filters. The photodiodes change an output signal, based on the amount of electrons generated. The aggregate of output signals from the photodiodes makes possible the detection of an image.

Figure 1:
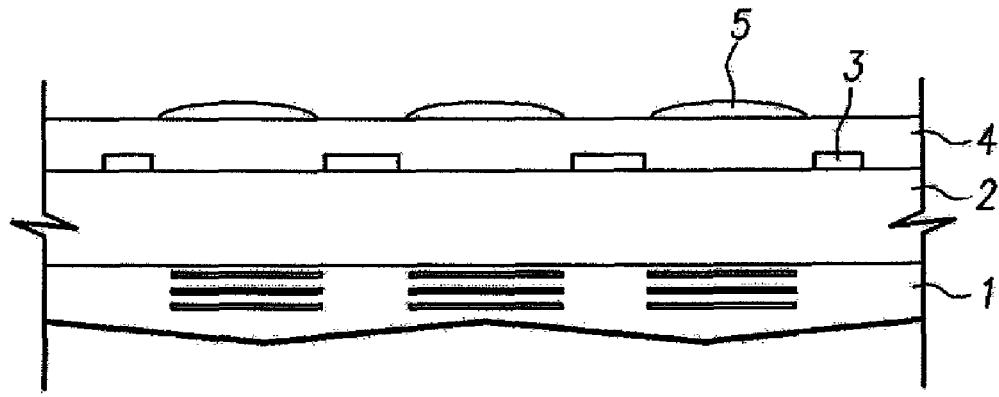

FIG. 1 is a sectional view illustrating a related CMOS image sensor. A method of fabricating the related CMOS image sensor will be described with reference to FIG. 1.

As shown in FIG. 1, an epitaxial layer 1 is formed over a semiconductor substrate by an epitaxial process. The epitaxial layer 1 includes a plurality of photodiodes. Subsequently, a plurality of devices (not shown) for signal processing are formed, and a plurality of metal wire layers (not shown) for interconnecting the respective signal processing devices are formed. Oxide film is applied to form a device passivation layer 2 for protecting the devices from moisture or external physical impact.

A dark matrix for intercepting unnecessary light is formed over the entire surface. At present, however, color filters 3, made of positive photoresist, are used as the dark matrix to only pass light having a green wavelength. A planarization layer 4 having a plane surface is formed to support micro lenses 5, which are formed in a subsequent process.

In the method of fabricating the related CMOS image sensor as described above, the green light color filters, used as the dark matrix, intercept red light and blue light but allow green light to pass. As a result, undesired signals are generated in the CMOS image sensor.

When red light color filters, blue light color filters, and green light color filters are successively arranged to intercept all the color components of light, the color filters must have a thickness of 3 μm or more to substantially completely intercept light. In addition, a hot pixel phenomenon, in which unnecessary signals are generated due to ambient temperature, occurs in the CMOS image sensor.

SUMMARY

Embodiments relate to a complementary metal oxide silicon (CMOS) image sensor, and more particularly, to a CMOS image sensor that is capable of substantially completely intercepting unnecessary light incident from the outside and preventing the occurrence of a hot pixel phenomenon and a method of fabricating the same. Embodiments relate to a method of fabricating a CMOS image sensor that is capable of forming a dark matrix to substantially completely intercept unnecessary light incident from the outside and preventing the occurrence of a hot pixel phenomenon and a method of fabricating the same. Embodiments relate to a CMOS image sensor that includes a dark matrix to substantially completely intercept unnecessary light incident from the outside, and prevents the occurrence of a hot pixel phenomenon.

Embodiments relate to a CMOS image sensor which includes an epitaxial layer having a plurality of photodiodes. The epitaxial layer may be formed over a main pixel region and a dummy pixel region, which may be defined on a semiconductor substrate. A device passivation layer may be formed by depositing and planarizing oxide over the epitaxial layer. A silicon oxide layer may be formed by depositing and planarizing silicon oxide over the device passivation layer. The silicon oxide layer may have a concavo-convex type oxide pattern over the main pixel region and a planar oxide pattern over the dummy pixel region. A plurality of dark matrix elements may be formed by sequentially stacking a dual layer and a metal layer over the silicon oxide layer. A planarization process may be performed until the concavo-convex type oxide pattern is exposed. Micro lenses may be formed such that the micro lenses are aligned with photodiodes which will be formed at the main pixel region and the dummy pixel region.

Embodiments relate to a method of fabricating a CMOS image sensor which includes forming an epitaxial layer having a plurality of photodiodes at a main pixel region and a dummy pixel region over a semiconductor substrate. An oxide may be deposited and planarized over the epitaxial layer to form a device passivation layer. Silicon oxide may be deposited and planarized over the device passivation layer to form a silicon oxide layer. A patterning process may be performed using a photoresist pattern over the silicon oxide layer over the main pixel region. This process will form an oxide pattern with a concavo-convex structure having a variation in height between photodiode regions and the remaining regions. A dark matrix pattern may be formed, including a plurality of dark matrix elements each including a dual layer and a metal layer over the main pixel region where the oxide pattern is formed. Micro lenses may be formed such that the micro lenses are aligned with and correspond to photodiodes which will be formed at the main pixel region and the dummy pixel region.

In embodiments, the step of forming the dark matrix pattern may include depositing the dual layer, which is made of titanium-based materials, over the entire surface of the substrate. Metal may be deposited over the dual layer to form a metal layer having relatively high flexibility. A planarization process may be performed until the oxide pattern at the main pixel region is exposed.

DRAWINGS

FIG. 1 is a sectional view illustrating a related CMOS image sensor.

Example FIGS. 2A to 2D are process views, in section, illustrating a method of fabricating a CMOS image sensor according to embodiments.

Figure 3:
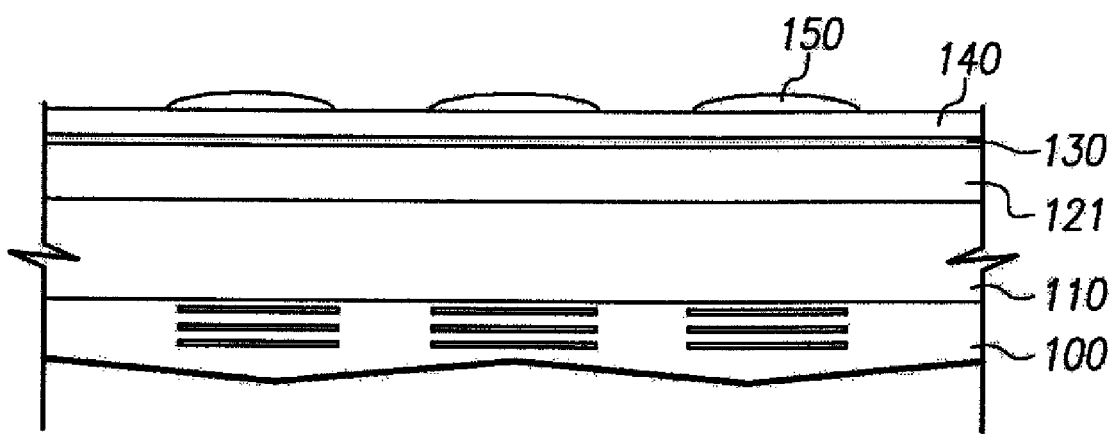

Example FIG. 3 is a sectional view illustrating a dummy pixel region formed by the method of fabricating the CMOS image sensor according to embodiments.

Figure 4:
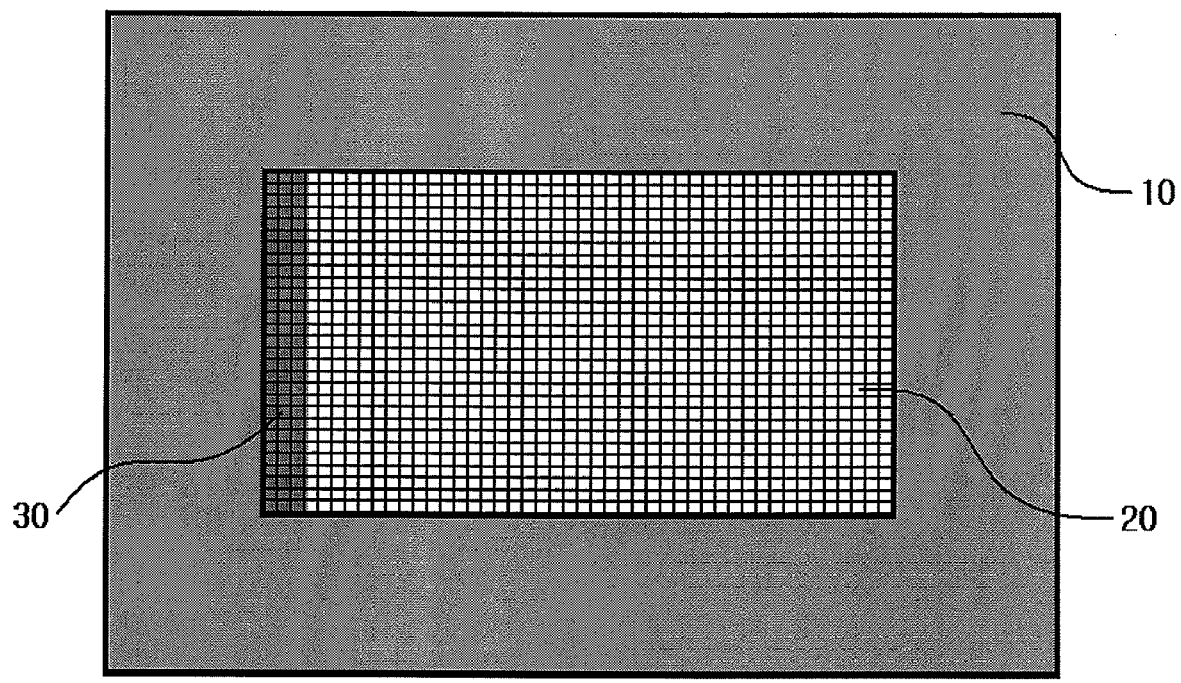

Example FIG. 4 is a plan view illustrating regions of a CMOS image sensor according to embodiments.

DESCRIPTION

Figure 2A:
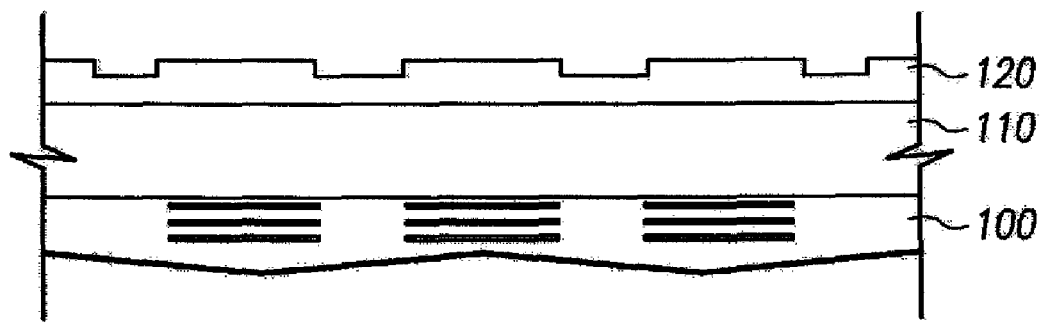

As shown in example FIG. 2A, an epitaxial layer 100 is formed over a semiconductor substrate, by an epitaxial process, to fabricate a CMOS image sensor according to embodiments. Dopant for photodiodes is injected into the epitaxial layer 100 to form an epitaxial layer 100 having a plurality of photodiodes. According to embodiments, a main pixel region and a dummy pixel region are defined on the semiconductor substrate.

After the epitaxial layer 100 having the plurality of photodiodes is formed, a device passivation layer 110 is formed over the epitaxial layer 100. The device passivation layer 110 may include a plurality of devices for signal processing and a plurality of metal wires for interconnecting the respective signal processing devices. Oxide is deposited to protect the devices from moisture or external physical impact, and the oxide is planarized. Additional silicon oxide is deposited over both the main pixel region and the dummy pixel region over the device passivation layer 110, and the silicon oxide is planarized to form a silicon oxide layer.

The additional silicon oxide layer in the main pixel region is patterned using a photoresist process. A pattern is formed in which a dark matrix will be included. The oxide pattern 120 has a pattern structure in which regions directly over the photodiode protrude and the remaining regions are depressed. In the oxide pattern 120, the height difference between the photodiode regions and the remaining regions may be approximately 400 Å to 1000 Å. That is, the oxide pattern 120 has a concavo-convex structure.

In the dummy pixel region, as shown in example FIG. 3, an additional silicon layer 121 is maintained plane on the device passivation layer 110. In addition, the silicon layer 121 is formed such that the silicon layer 121 has a thickness equal to the minimum thickness of the oxide pattern 120 at the main pixel region, i.e., the thickness of the concave parts of the oxide pattern 120. As a result, a plane silicon oxide layer 121 having a thickness equal to that of the concave parts of the oxide pattern 120 is formed at the dummy pixel region.

Figure 2B:
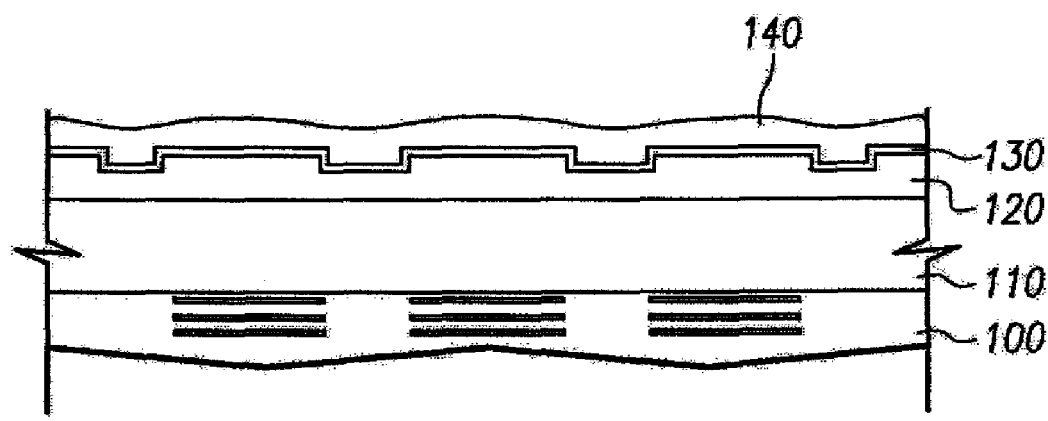
Figure 2C:
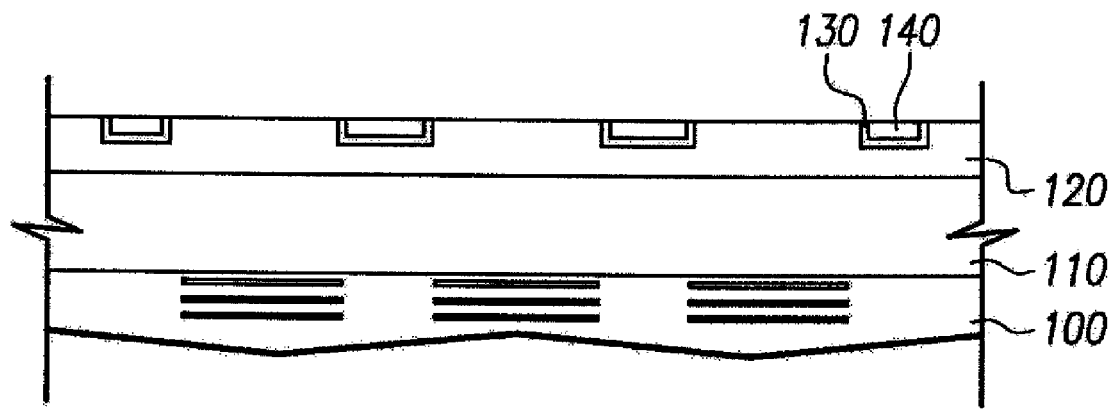

Referring to example FIG. 2B and example FIG. 2C, a dark matrix pattern including a stacked dual layer 130 and metal layer 140, may be formed over the oxide pattern 120. Specifically, as shown in example FIG. 2B, a Ti/TiN layer 130 is deposited over the oxide pattern 120 at the main pixel region and the silicon oxide layer 121 at the dummy pixel region. The Ti/TiN layer 130 serves to substantially completely intercept light from the outside and improve adhesion to a metal layer 140 having a high flexibility, which will be formed later. According to embodiments, the layer 130 is constructed as a dual layer including a Ti layer and a TiN layer. The TiN layer serves to prevent the reflection of light, whereas the Ti layer serves to prevent the transmission of light.

A chemical vapor deposition (CVD) or physical vapor deposition (PVD) process, for example, self-ionized plasma (SIP) sputtering or hollow cathode magnetron (HCM) sputtering is used to form the Ti/TiN layer 130. The Ti layer may be approximately 100 Å to 300 Å thick. The TiN layer, formed over the Ti layer, may be formed in the same fashion as the Ti layer.

For example, the Ti layer may be formed by SIP or HCM sputtering according to the PVD process. The Ti layer is formed by the sputtering while Ti is used as a target. After that, nitrogen gas is supplied into a chamber to form the Ti layer such that the Ti layer has a thickness of approximately 100 Å to 300 Å.

After the Ti/TiN layer 130 is formed, metal is deposited over the Ti/TiN layer 130, by the PVD process, to form a metal layer 140 having a high flexibility. In embodiments, tungsten (W) may be used as the metal layer 140 having high flexibility. The tungsten is deposited over the Ti/TiN layer 130 by the PVD process. The Ti/TiN layer 130 is formed over the oxide pattern 120 such that the concavo-convex structure of the oxide pattern 120 is maintained. According to embodiments, the tungsten is deposited over the Ti/TiN layer 130 such that the concave parts of the Ti/TiN layer 130 are sufficiently filled with the tungsten.

After the deposition of the metal layer 140, as shown in example FIG. 2C, a planarization process, for example, a chemical mechanical polishing (CMP) process, is carried out until the oxide pattern 120 at the main pixel region is exposed. As a result, a dark matrix pattern is formed including the Ti/TiN layer 130 and the metal layer 140 of tungsten (W). All the regions, including the metal layer 140 of tungsten (W), may be planarized such that both the main pixel region and the dummy pixel region are simultaneously planarized to the same height.

Figure 2D:
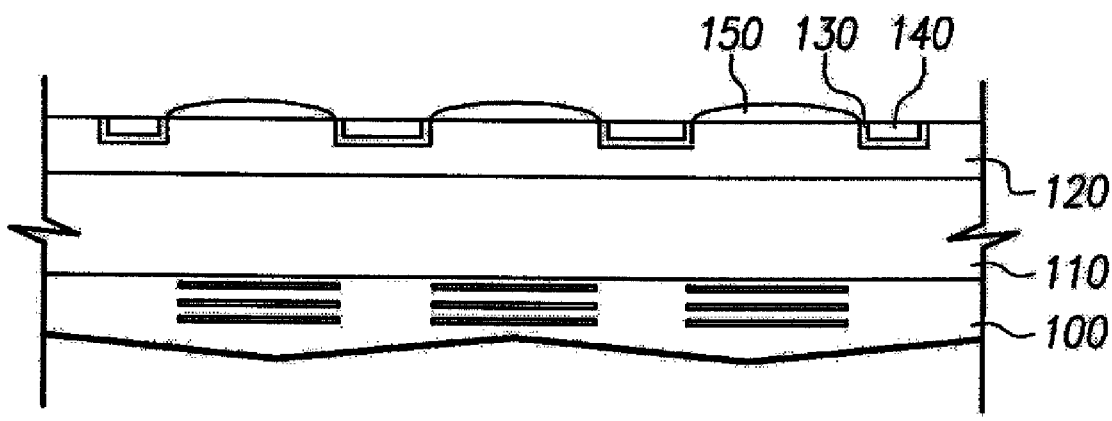

As shown in example FIG. 2D, a plurality of micro lenses 150 are formed at both the main pixel region, such that the micro lenses 150 correspond to the photodiodes. As shown in example FIG. 3, a plurality of micro lenses 150 are formed at the dummy pixel region. The micro lenses are formed over the metal layer 140 of tungsten (W), at the dummy pixel region. The micro lenses are formed over the exposed part of the silicon oxide layer, which is exposed by the planarization, at the main pixel region. To this end, the process is carried out such that the height of the layer (oxide layer) over the main pixel region, over which the micro lenses are formed, is equal to the height of the layer (metal layer) at the dummy pixel region.

Consequently, as shown in example FIG. 2D, a plurality of dark matrix elements, each including the Ti/TiN layer 130 and the metal layer 140 of tungsten (W), are formed between the micro lenses 150 at the main pixel region. In other words, the micro lenses 150 are formed between the plurality of dark matrix elements at the main pixel region. At the dummy pixel region, external light is substantially completely intercepted using the Ti/TiN layer 130 and the metal layer 140 of tungsten (W).

Specifically, the metal layer 140 of tungsten (W) may be formed such that the metal layer 140 has a thickness of approximately 400 Å. At this thickness, the metal layer 140 has a transmittance of 0.05% or less with respect to wavelengths of visible light. Consequently, the metal layer 140 has an advantage in that the metal layer 140 intercepts almost all light components.

The dummy pixel region where external light is substantially completely intercepted using the Ti/TiN layer 130 and the metal layer 140 of tungsten (W), i.e., a dummy pixel region 30 shown in example FIG. 4, serves to improve the image characteristics through image signal processing (ISP).

Specifically, the signal difference responding at room temperature between the dummy pixel region 30 and a main pixel region 20, is calculated, and the calculated signal difference is compared with the signal difference responding at a high temperature. When a hot pixel phenomenon occurs due to the temperature at the main pixel region 20, the signal difference between the dummy pixel region 30 and the main pixel region 20 is great. Consequently, when the signal difference is processed such that the signal difference is removed through the ISP, the hot pixel phenomenon is restrained on an output image. To this end, light is substantially completely intercepted at the dummy pixel region 30.

According to embodiments, therefore, it is possible to substantially completely intercept external light by forming the Ti/TiN layer 130 and the metal layer 140 of tungsten (W) at the dummy pixel region 30, thereby restraining the occurrence of the hot pixel phenomenon. As a result, noise, generated by the hot pixel phenomenon, is removed, whereby the image characteristics are maximized.

As apparent from the above description, the dark matrix pattern, including the Ti/TiN layer pattern and the metal layer pattern of tungsten (W), is formed between the micro lenses at the main pixel region, and unnecessary light incident from the outside is substantially completely intercepted, using the Ti/TiN layer and the metal layer of tungsten (W), at the dummy pixel region.

Consequently, embodiments have the effect of preventing the occurrence of the hot pixel phenomenon, and therefore, effectively removing noise, which is generated by the hot pixel phenomenon. Accordingly, embodiments have the effect of maximizing the image characteristics of the image sensors.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an epitaxial layer having a plurality of photodiodes over a semiconductor substrate having a main pixel region and a dummy pixel region;
   depositing and planarizing oxide over the epitaxial layer to form a device passivation layer;
   depositing and planarizing silicon oxide over the device passivation layer to form a silicon oxide layer;
   patterning the silicon oxide over the main pixel region to form a concavo-convex structure;
   forming a dark matrix pattern from a plurality of dark matrix elements, each dark matrix element including a dual layer and a metal layer over the main pixel region where the oxide pattern is formed; and
   forming micro lenses aligned with the photodiodes in the main pixel region.

2. The method of claim 1, wherein a difference in a height of the convex silicon oxide layer over the photodiode regions and a height of the concave silicon oxide layer over the remaining regions is approximately 400 Å to 1000 Å.

3. The method of claim 1, wherein forming the dark matrix pattern includes:
   depositing the dual layer, which is made of titanium-based materials, over the entire surface of the substrate,
   depositing metal over the deposited dual layer to form a metal layer having a high flexibility, and
   performing a planarization process until a top part of the silicon oxide pattern at the main pixel region is exposed.

4. The method of claim 3, wherein the micro lenses at the main pixel region are formed over the exposed top part of the silicon oxide pattern.

5. The method of claim 1, wherein the dual layer is formed of Ti and TiN.

6. The method of claim 1, wherein the metal layer is formed of tungsten.

7. The method of claim 1, comprising:
   forming a planar silicon oxide layer, having a thickness equal to that of concave parts of the silicon oxide pattern, at the dummy pixel region.

8. The method of claim 1, wherein the micro lenses at the main pixel region are formed between the dark matrix elements.

9. The method of claim 1, wherein patterning the silicon oxide over the main pixel region to form a concavo-convex structure uses a photo resist process.

10. The method of claim 1, wherein micro lenses are formed over and aligned with the photodiodes in the dummy pixel region.

11. An apparatus comprising:
    an epitaxial layer having a plurality of photodiodes, the epitaxial layer being formed at a main pixel region and a dummy pixel region defined over a semiconductor substrate;
    a device passivation oxide layer over the epitaxial layer;
    a silicon oxide layer over the device passivation oxide layer, the silicon oxide layer having a concavo-convex pattern at the main pixel region and a planar pattern at the dummy pixel region;
    a plurality of dark matrix elements each including a dual layer and a metal layer over the silicon oxide layer; and
    micro lenses aligned with photodiodes in the main pixel region.

12. The apparatus of claim 11, wherein the concavo-convex pattern has a height difference in the silicon oxide between photodiode regions where photodiodes will be formed and the remaining regions.

13. The apparatus of claim 11, wherein the silicon oxide of the planar pattern has a thickness equal to that of the thickness of the silicon oxide of the concave parts of the concavo-convex pattern.

14. The apparatus of claim 11, wherein the device passivation oxide layer includes a plurality of devices for signal processing and a plurality of metal wires for interconnecting the respective signal processing devices, which are located over the epitaxial layer.

15. The apparatus of claim 11, wherein the dual layer includes Ti and TiN.

16. The apparatus of claim 11, wherein the metal layer includes tungsten.

17. The apparatus of claim 11, wherein the micro lenses are formed between the dark matrix elements.

18. The apparatus of claim 11, wherein the micro lenses in the main pixel region are over the exposed part of the silicon oxide layer.

19. The apparatus of claim 11, wherein the dummy pixel region includes micro lenses formed over and aligned with the photodiodes.

20. The apparatus of claim 19, wherein a metal layer is formed over the photodiodes in the dummy pixel region, and the micro lenses are formed over the metal layer.

* * * * *